(12) United States Patent
Tokunaga

(10) Patent No.: US 8,456,149 B2
(45) Date of Patent: Jun. 4, 2013

(54) ELECTRONIC APPARATUS AND METHOD OF CALCULATING INPUT POWER VALUE OF POWER SUPPLY UNIT IN ELECTRONIC APPARATUS

(75) Inventor: Tomoaki Tokunaga, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/166,696

(22) Filed: Jun. 22, 2011

(65) Prior Publication Data

US 2012/0112735 A1    May 10, 2012

(51) Int. Cl.
*G01R 19/00* (2006.01)

(52) U.S. Cl.
USPC ...................................................... 324/76.11

(58) Field of Classification Search
None
See application file for complete search history.

(56) References Cited

U.S. PATENT DOCUMENTS

| | | | | |
|---|---|---|---|---|
| 4,717,872 A * | 1/1988 | Wagner et al. | ................. | 324/127 |
| 6,285,191 B1 | 9/2001 | Gollomp et al. | | |
| 7,733,676 B2 * | 6/2010 | Nunoya et al. | ................. | 363/72 |
| 7,974,795 B2 * | 7/2011 | Tohyama | ....................... | 702/63 |
| 2008/0018325 A1 * | 1/2008 | Yu et al. | ......................... | 324/142 |
| 2009/0256505 A1 * | 10/2009 | Maeda et al. | ............ | 318/400.07 |
| 2011/0266869 A1 * | 11/2011 | Katru et al. | ..................... | 307/39 |
| 2011/0270456 A1 * | 11/2011 | Kouda et al. | .................. | 700/292 |

FOREIGN PATENT DOCUMENTS

| | | |
|---|---|---|
| JP | 07-106087 | 4/1995 |
| JP | 07-129256 | 5/1995 |
| JP | 9-185437 | 7/1997 |
| JP | 11-327663 | 11/1999 |
| JP | 2003-511313 | 3/2003 |
| JP | 2006-098111 | 4/2006 |
| JP | 2010-051154 | 3/2010 |

OTHER PUBLICATIONS

English translation of JP09-185437 filed on Jul. 15, 1997.*
English translation of JP2006-098111 filed on Apr. 13, 2006.*
Japanese Patent Application No. 2010-256103, Notice of Reasons for Rejection, mailed Nov. 1, 2011, (with English Translation).

* cited by examiner

*Primary Examiner* — Jermele M Hollington
(74) *Attorney, Agent, or Firm* — Blakely, Sokoloff, Taylor & Zafman LLP

(57) ABSTRACT

According to one embodiment, an electronic apparatus includes a power supply unit, a current value calculator, and an input power value calculator. The current value calculator is configured to calculate a current value on a power supply cable led out from the power supply unit based on a voltage between two ends of the power supply cable and a resistance value of the power supply cable. The input power value calculator is configured to calculate an input power value of the power supply unit based on the current value on the power supply cable calculated by the current value calculator and an input/output characteristic (efficiency) of the power supply unit.

14 Claims, 4 Drawing Sheets

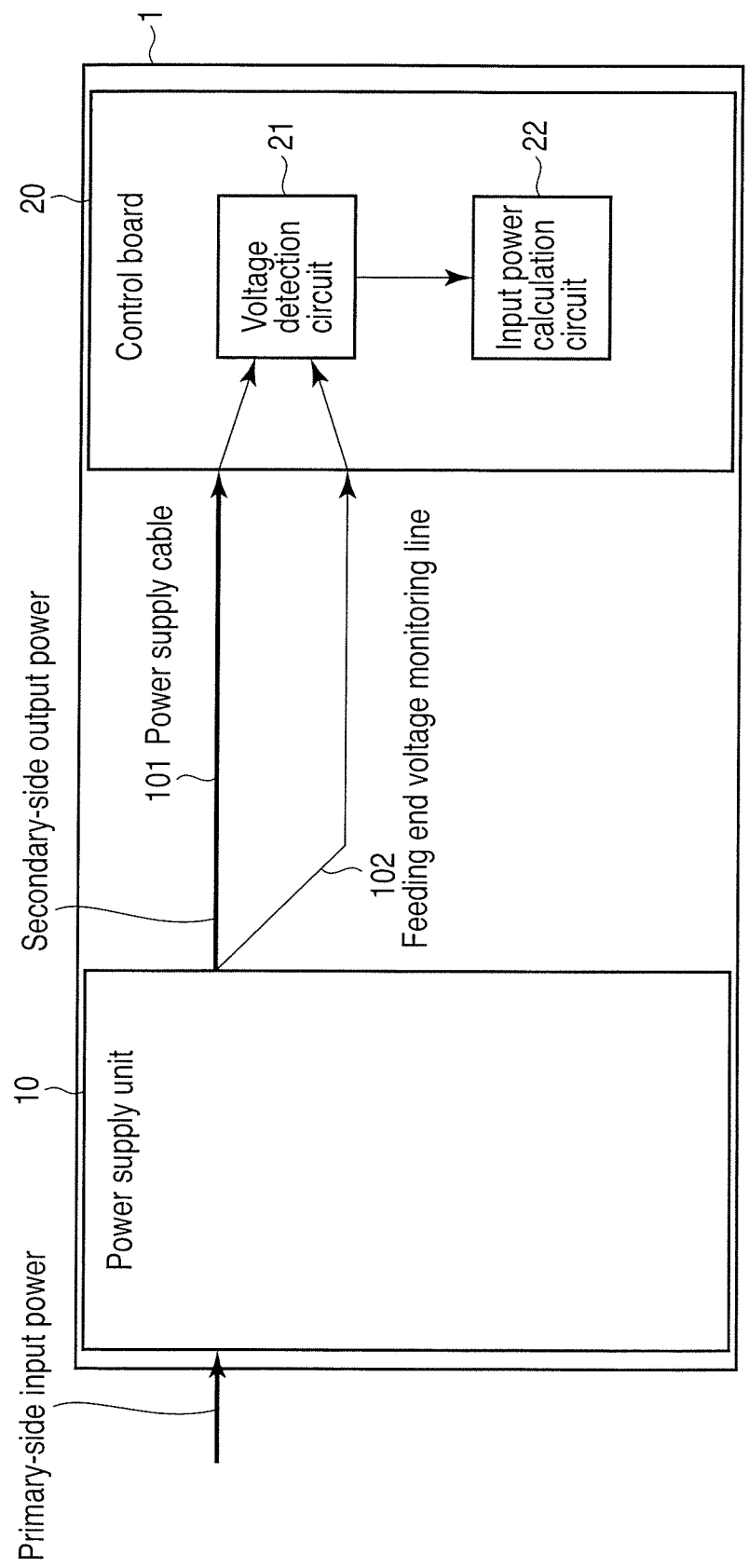
F I G. 1

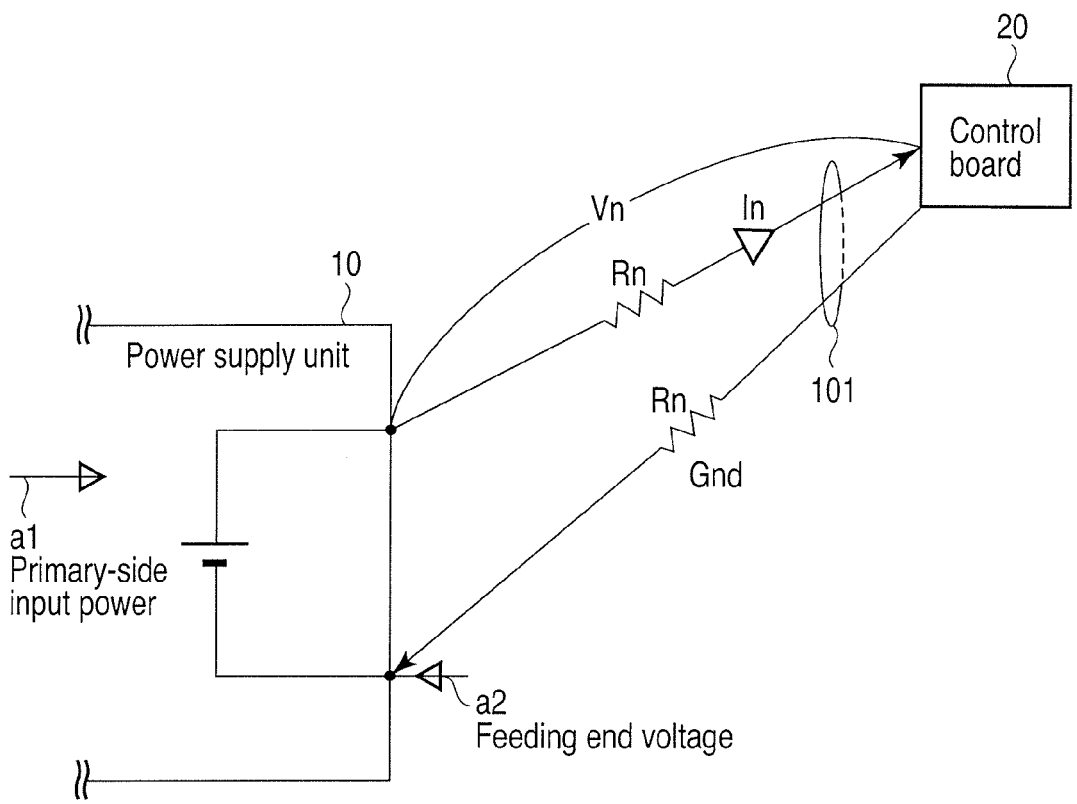
F I G. 2
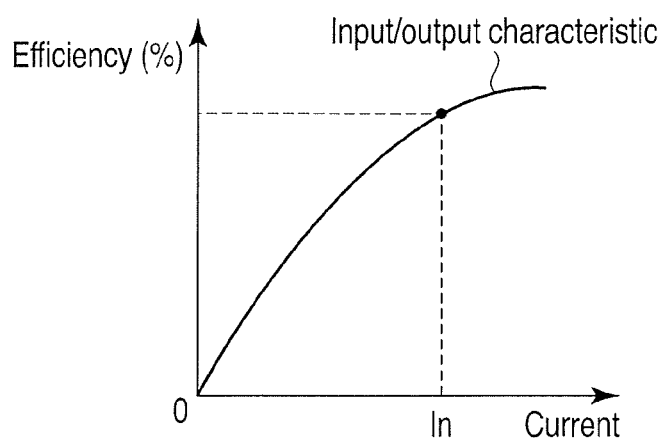
F I G. 3

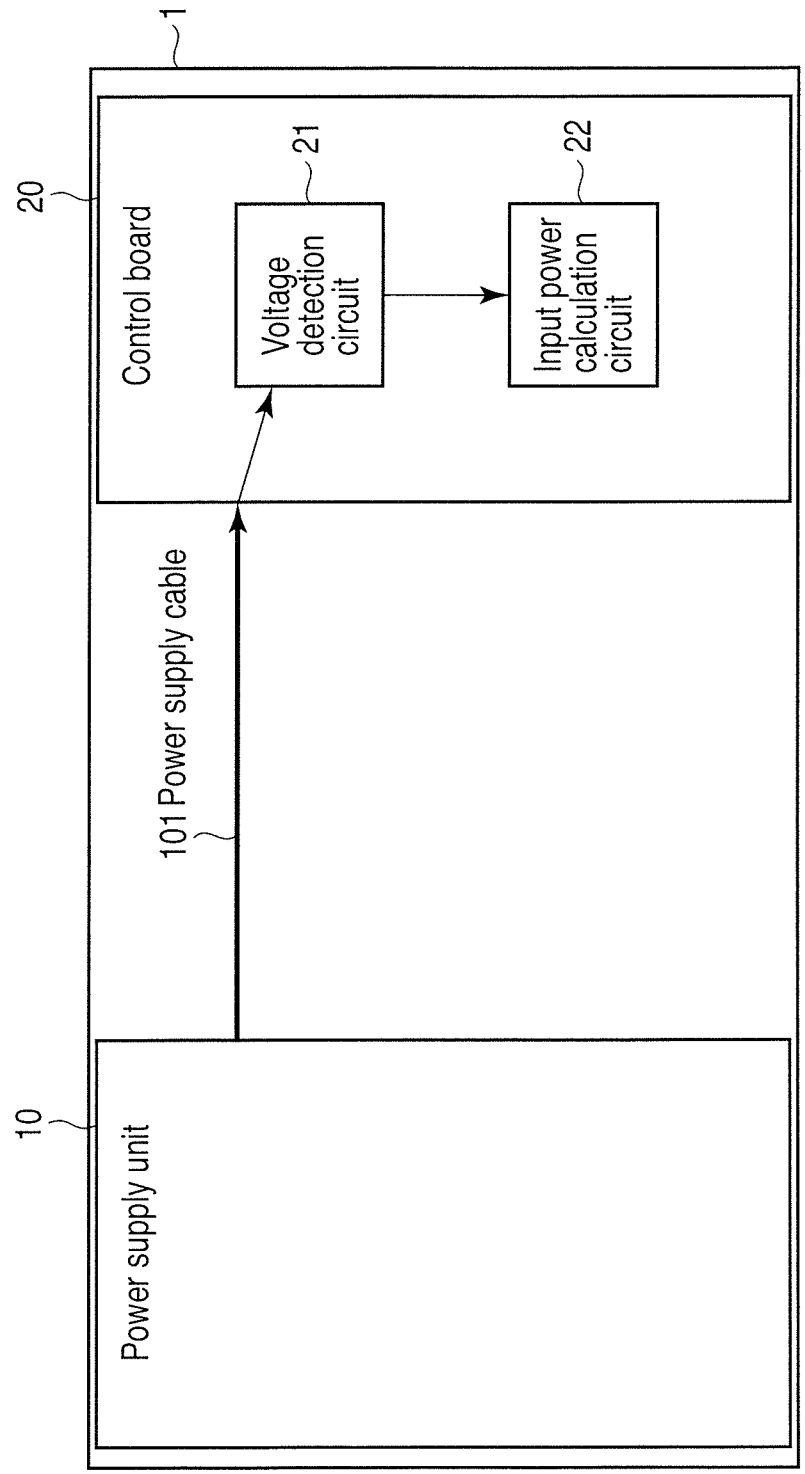
F I G. 4

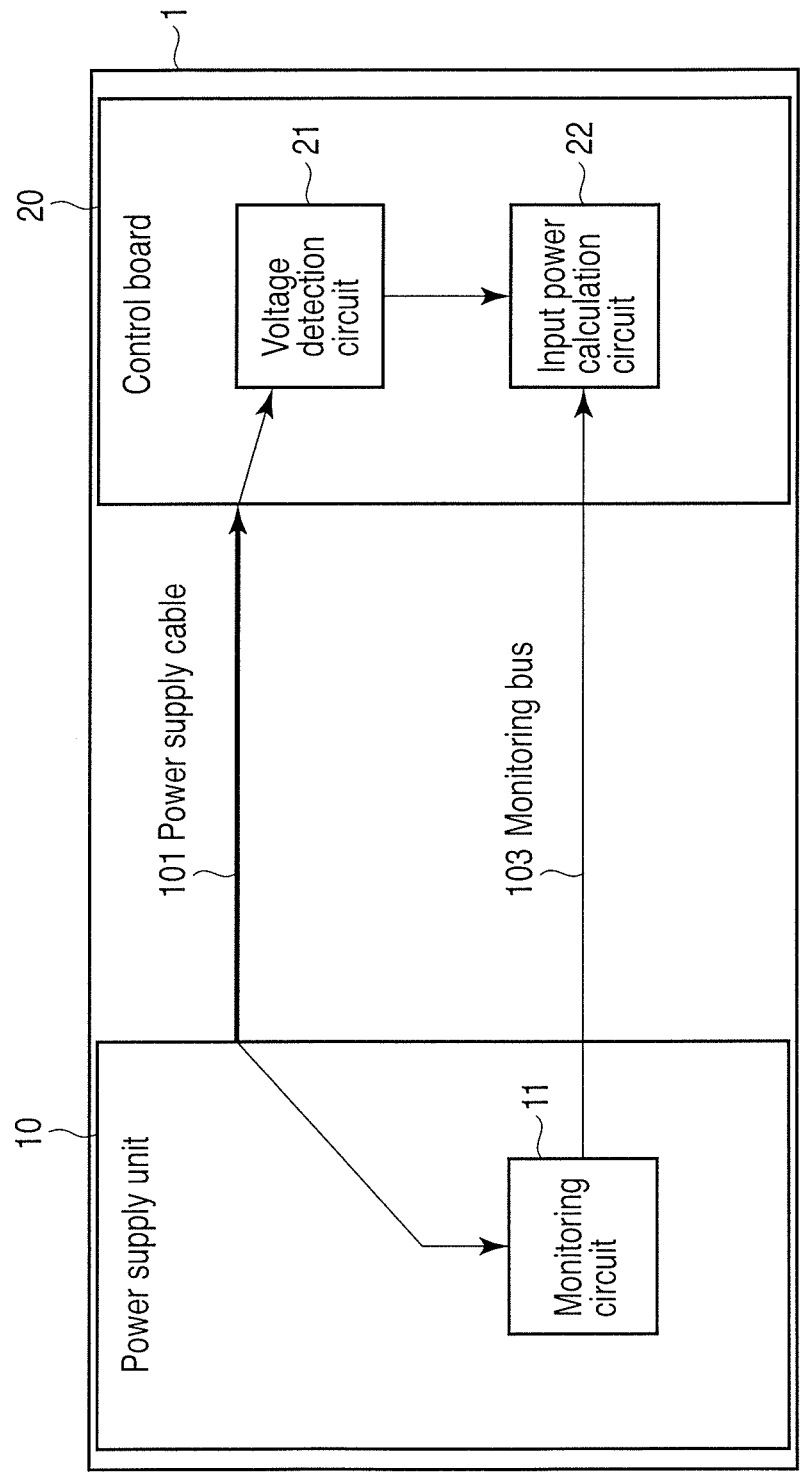
F I G. 5

ELECTRONIC APPARATUS AND METHOD OF CALCULATING INPUT POWER VALUE OF POWER SUPPLY UNIT IN ELECTRONIC APPARATUS

CROSS-REFERENCE TO RELATED APPLICATIONS

This application is based upon and claims the benefit of priority from Japanese Patent Application No. 2010-256103, filed Nov. 16, 2010; the entire contents of which are incorporated herein by reference.

FIELD

Embodiments described herein relate generally to an electronic apparatus including a power supply unit mounted thereon and an input power calculation method for the power supply unit in the electronic apparatus.

BACKGROUND

In recent years, an environmental protection issue has attracted much attention and it is strongly required to save electricity more than before as part of the environmental protection. Further, for example, the development of various electronic apparatuses each including a function of measuring actual power consumption on each occasion is strongly required in order to display the present power consumption amount for calling the user's attention to power saving and control the operation of suppressing the power consumption amount less than a preset amount.

For example, a large-scale computer such as a server includes a power supply unit mounted thereon and is operated as a computer system by supplying electric power from the power supply unit to a main board.

With the above computer system, a power measurement circuit that measures input power (that is, actual power consumption) of the power supply unit must be incorporated in the power supply unit in order to monitor actual power consumption on each occasion.

However, most of the power supply units do not include the power measurement circuit and it is impossible to know actual power consumption of the whole system in a computer system configured on a computer including a power supply unit mounted thereon that includes no power measurement circuit.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is an exemplary block diagram showing a schematic system configuration of an electronic apparatus according to a first embodiment.

FIG. 2 is an exemplary schematic diagram equivalently showing a flow of electricity on the electronic apparatus of the first embodiment.

FIG. 3 is an exemplary diagram showing an example of an input/output characteristic (efficiency) of a power supply unit mounted on the electronic apparatus of the first embodiment.

FIG. 4 is an exemplary block diagram showing a schematic system configuration of an electronic apparatus according to a second embodiment.

FIG. 5 is an exemplary block diagram showing a schematic system configuration of an electronic apparatus according to a third embodiment.

DETAILED DESCRIPTION

Various embodiments will be described hereinafter with reference to the accompanying drawings.

In general, according to one embodiment, an electronic apparatus includes a power supply unit, a current value calculator, and an input power value calculator. The current value calculator is configured to calculate a current value on a power supply cable led out from the power supply unit based on a voltage between two ends of the power supply cable and a resistance value of the power supply cable. The input power value calculator is configured to calculate an input power value of the power supply unit based on the current value on the power supply cable calculated by the current value calculator and an input/output characteristic (efficiency) of the power supply unit.

(First Embodiment)

First, a first embodiment is explained. FIG. 1 is an exemplary block diagram showing the schematic system configuration of an electronic apparatus according to this embodiment. For example, the electronic apparatus 1 is realized as a large-scale computer called a server or the like.

As shown in FIG. 1, the electronic apparatus 1 is roughly divided into a power supply unit 10 and control board 20. The power supply unit 10 is an AC-DC power supply unit that supplies electric power to a system (load). Further, the control board 20 is a main board of the system. Generally, it corresponds to a motherboard. A power supply cable 101 that supplies electric power from the power supply unit 10 to the control board 20 is laid between the power supply unit 10 and the control board 20.

In this example, electric power input from an AC commercial power source or the like to the power supply unit 10 is referred to as primary-side input power and electric power output from the power supply unit 10 to the control board 20 is referred as secondary-side output power. Further, in this case, it is assumed that the power supply unit 10 does not include a power measurement circuit used to measure primary-side input power. The electronic apparatus 1 of this embodiment is configured to detect primary-side input power on the control board 20 side even if the power supply unit 10 does not include a power measurement circuit and this point is explained in detail below.

In a state in which the power supply unit 10 does not include a power measurement circuit, as shown in FIG. 1, the electronic apparatus 1 of this embodiment includes a feeding end voltage monitoring line 102 laid between the power supply unit 10 and the control board 20 in order to detect primary-side input power on the control board 20 side. Further, a voltage detection circuit 21 and an input power calculation circuit 22 are provided on the control board 20.

The feeding end voltage monitoring line 102 is a voltage monitoring line for a voltage of the feeding end (on the power supply unit 10 side) of the power supply cable 101. Since the feeding end voltage monitoring line 102 is used only for monitoring and a large current will not be passed therethrough, a drop voltage therein is extremely small. Therefore, the voltage monitoring operation can be performed with high precision.

The voltage detection circuit 21 is a circuit that detects a potential difference between the two ends of the power supply cable 101. The voltage detection circuit 21 measures a voltage at the end of the power supply cable 101 (connected to the control board 20) and measures a voltage of the feeding end (on the power supply unit 10 side) of the power supply cable 101 by use of the feeding end voltage monitoring line 102. The voltage detection circuit 21 then compares the two measured values to detect a potential difference between the two ends of the power supply cable 101.

The input power calculation circuit 22 is a circuit that calculates input power of the power supply unit 10, that is, primary-side input power. The input power calculation circuit 22 calculates a current flowing through the power supply cable 101 based on the potential difference between the two ends of the power supply cable 101 detected by the voltage detection circuit 21 and then calculates primary-side input power based on the calculated current of the power supply cable 101. The calculation principle of the primary-side input power is explained with reference to FIG. 2 and FIG. 3.

FIG. 2 is an exemplary schematic diagram equivalently showing a flow of electricity on the electronic apparatus 1 of this embodiment.

Resistance of the power supply cable 101 ($R_n$: resistance of power supply cable) is previously given to the input power calculation circuit 22 that receives the potential difference ($V_n$: end-to-end voltage of power supply cable) between the two ends of the power supply cable 101 from the voltage detection circuit 21. Therefore, the input power calculation circuit 22 can calculate a current ($I_n$: current of power supply cable) flowing in the power supply cable 101 according to the following equation (Equation 1).

current of power supply cable ($I_n$)=end-to-end voltage of power supply cable ($V_n$)/resistance of power supply cable ($R_n$)  (Equation 1)

If a value of the current of power supply cable ($I_n$) is detected, the input power calculation circuit 22 calculates secondary-side output power ($W_2$) according to the following equation (Equation 2).

Secondary-side output power ($W_2$)=end-to-end voltage of power supply cable ($V_n$)×current of power supply cable ($I_n$)  (Equation 2)

Further, information related to the input/output characteristic (efficiency) of the power supply unit 10 as shown in FIG. 3, for example, is also previously given to the input power calculation circuit 22. An input/output characteristic (efficiency) is determined when the power supply unit 10 is formed and the power supply unit 10 has an inherent input/output characteristic (efficiency). Therefore, the input power calculation circuit 22 acquires efficiency ($e_n$) of the power supply unit 10 based on the calculated current of power supply cable ($I_n$) according to the input/output characteristic (efficiency) and then calculates primary-side input power ($W_1$) according to the following equation (Equation 3).

Primary-side input power ($W_1$)=secondary-side output power ($W_2$)/efficiency ($e_n$)  (Equation 3)

That is, the primary-side input power ($W_1$: a1 in FIG. 2) can be calculated if the current of power supply cable ($I_n$) is obtained. Further, the current of power supply cable ($I_n$) can be calculated if the end-to-end voltage of power supply cable ($V_n$) is obtained. Then, the feeding end voltage monitoring line 102 that measures the feeding end voltage (a2 in FIG. 2) is provided and the electronic apparatus 1 of this embodiment acquires the end-to-end voltage of power supply cable ($V_n$) by use of the voltage detection circuit 21, calculates a current of power supply cable ($I_n$) by the input power calculation circuit 22 and calculates primary-side input power ($W_1$).

On a general-purpose computer system, a monitoring processor is mounted and the calculation process by the input power calculation circuit 22 shown in the drawing can be performed by the monitoring processor (even if the input power calculation circuit 22 is not newly provided).

Thus, the electronic apparatus 1 of this embodiment can detect primary-side input power on the control board 20 side even if the power supply unit 10 does not include the power measuring function.

(Second Embodiment)

Next, a second embodiment is explained. FIG. 4 is an exemplary block diagram showing a schematic system configuration of an electronic apparatus of this embodiment.

Like the electronic apparatus 1 of the first embodiment described above, the basic operation of the electronic apparatus 1 of this embodiment is to acquire a end-to-end voltage of power supply cable ($V_n$), calculate a current of power supply cable ($I_n$) and calculate primary-side input power ($W_1$) based on the calculated current of power supply cable ($I_n$). The electronic apparatus 1 of this embodiment is different from the electronic apparatus 1 of the first embodiment in a method for measuring a end-to-end voltage of power supply cable ($V_n$).

As shown in FIG. 4, the electronic apparatus 1 of this embodiment does not include a feeding end voltage monitoring line 102 (that is laid in the electronic apparatus 1 of the first embodiment). In the electronic apparatus 1 of this embodiment, a rated output voltage at the non-output time of the power supply unit 10 is used as a voltage of the feeding end of a power supply cable 101 (on the power supply unit 10 side). The rated output voltage at the non-output time of the power supply unit 10 is previously given to an input power calculation circuit 22.

A voltage detection circuit 21 in this embodiment measures a voltage at the end of the power supply cable 101 (connected to a control board 20) and notifies a measured value to the input power calculation circuit 22.

Further, the input power calculation circuit 22 in this embodiment first derives a difference between a end voltage of the power supply cable 101 (connected to the control board 20) received from the voltage detection circuit 21 and a feeding end voltage of the power supply cable 101 (on the power supply unit 10 side), that is, a previously given rated output voltage at the non-output time of the power supply unit 10 to detect a potential difference ($V_n$: end-to-end voltage of power supply cable) between the two ends of the power supply cable 101.

After the end-to-end voltage of power supply cable ($V_n$) is calculated, the input power calculation circuit 22 calculates a current ($I_n$: current of power supply cable) flowing in the power supply cable 101 according to Equation 1 based on the calculated value of the end-to-end voltage of power supply cable ($V_n$) and previously given resistance ($R_n$: resistance of power supply cable) of the power supply cable 101.

Next, the input power calculation circuit 22 calculates secondary-side output power ($W_2$) based on the calculated value of the current of power supply cable ($I_n$) according to Equation 2 and further calculates primary-side input power ($W_1$) based on the calculated value of the secondary-side output power ($W_2$) according to Equation 3.

On a general-purpose computer system, a monitoring processor is mounted and the calculation process by the input power calculation circuit 22 shown in the drawing can be performed by the monitoring processor (even if the input power calculation circuit 22 is not newly provided).

Thus, the electronic apparatus 1 of this embodiment can detect primary-side input power on the control board 20 side even if the power supply unit 10 does not include the power measuring function.

(Third Embodiment)

Next, a third embodiment is explained. FIG. 5 is an exemplary block diagram showing a schematic system configuration of an electronic apparatus of this embodiment.

Like the electronic apparatuses 1 of the first and second embodiments described before, the basic operation of the electronic apparatus 1 of this embodiment is to acquire a end-to-end voltage of power supply cable ($V_n$), calculate a current of power supply cable ($I_n$) and calculate primary-side input power ($W_1$) based on the calculated value of the current of power supply cable ($I_n$). The electronic apparatus 1 of this embodiment is different from the electronic apparatuses 1 of the first and second embodiments in a method for measuring a end-to-end voltage of power supply cable ($V_n$).

As shown in FIG. 5, in the electronic apparatus 1 of this embodiment, a power supply unit 10 includes a monitoring circuit 11. Further, a monitoring bus 103 is laid between the power supply unit 10 and a control board 20.

The monitoring circuit 11 is a monitoring logic circuit contained in the power supply unit. A voltage at the feeding end of a power supply cable 101 (on the power supply unit 10 side) is measured by the monitoring circuit 11. The monitoring circuit 11 does not include a function of measuring primary-side input power. The measured voltage at the feeding end of the power supply cable 101 (on the power supply unit 10 side) is notified to the control board 20 via the monitoring bus 103.

The voltage detection circuit 21 of this embodiment measures a voltage at the end of the power supply cable 101 (connected to the control board 20) and notifies a measured value to an input power calculation circuit 22.

Further, the input power calculation circuit 22 in this embodiment first derives a difference between an end voltage of the power supply cable 101 (connected to the control board 20) received from the voltage detection circuit 21 and a feeding end voltage of the power supply cable 101 (on the power supply unit 10 side) received from the power supply unit 10 via the monitoring bus 103 to detect a potential difference ($V_n$: end-to-end voltage of power supply cable) between the two ends of the power supply cable 101.

After the end-to-end voltage of power supply cable ($V_n$) is calculated, the input power calculation circuit 22 calculates a current ($I_n$: current of power supply cable) flowing in the power supply cable 101 according to Equation 1 based on the calculated value of the end-to-end voltage of power supply cable ($V_n$) and previously given resistance ($R_n$: resistance of power supply cable) of the power supply cable 101.

Next, the input power calculation circuit 22 calculates secondary-side output power ($W_2$) based on the calculated value of the current of power supply cable ($I_n$) according to Equation 2 and further calculates primary-side input power ($W_1$) based on the calculated value of the secondary-side output power ($W_2$) according to Equation 3.

On a general-purpose computer system, a monitoring processor is mounted and the calculation process by the input power calculation circuit 22 shown in the drawing can be performed by the monitoring processor (even if the input power calculation circuit 22 is not newly provided).

Thus, the electronic apparatus 1 of this embodiment can detect primary-side input power on the control board 20 side even if the power supply unit 10 does not include the power measuring function.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a power supply module;
a current value calculator to calculate a current value on a power supply cable led out from the power supply module based on a potential difference between two ends of the power supply cable and a resistance value of the power supply cable; and
an input power value calculator to acquire efficiency of the power supply module from the current value calculated by the current value calculator and to calculate an input power value of the power supply module based on a previously-given input/output characteristic of the power supply module.

2. The apparatus of claim 1, further comprising:
a voltage monitoring line to monitor a voltage value at an end of the power supply cable on the power supply module side; and
a potential difference detector to measure a voltage value at a terminal end of the power supply cable connected to a load side, and to detect the potential difference between the two ends of the power supply cable based on the measured voltage value at the terminal end of the power supply cable and the voltage value at the power supply end of the power supply cable obtained via the voltage monitoring line.

3. The apparatus of claim 1, wherein the input power value calculator is to calculate an output power value of the power supply module based on the current value on the power supply cable calculated by the current value calculator and the potential difference between the two ends of the power supply cable, and to calculate the input power value of the power supply module based on the calculated output power value of the power supply module according to the input/output characteristic of the power supply module.

4. The apparatus of claim 1, further comprising a potential difference detector to measure a voltage value at a terminal end of the power supply cable connected to a load side, and to detect the potential difference between the two ends of the power supply cable based on the measured voltage value at the terminal end of the power supply cable and a rated output voltage value at a non-output time of the power supply module.

5. The apparatus of claim 4, wherein the input power value calculator is to calculate an output power value of the power supply module based on the current value on the power supply cable calculated by the current value calculator and the potential difference between the two ends of the power supply cable, and to calculate the input power value of the power supply module based on the calculated output power of the power supply module according to the input/output characteristic of the power supply module.

6. The apparatus of claim 1, further comprising:
a signal line to receive a voltage value of a power supply end of the power supply cable on the power supply module side; and
a potential difference detector to measure a voltage value at a terminal end of the power supply cable connected to a load side, and to detect the potential difference between the two ends of the power supply cable based on the measured voltage at the terminal end of the power supply cable and the voltage value of the power supply end of the power supply cable received via the signal line.

7. The apparatus of claim 6, wherein the input power value calculator is to calculate an output power value of the power supply module based on the current value on the power supply cable calculated by the current value calculator and the potential difference between the two ends of the power supply cable, and to calculate the input power value of the power supply module based on the calculated output power value of the power supply module according to the input/output characteristic of the power supply module.

8. A method of calculating an input power value of a power supply module in an electronic apparatus, the method comprising:
calculating a current value on a power supply cable led out from the power supply module based on a potential difference between two ends of the power supply cable and a resistance value of the power supply cable; and
acquiring efficiency of the power supply module from the calculated current value and calculating an input power value of the power supply module, based on a previously-given input/output characteristic of the power supply module.

9. The method of claim 8, further comprising:
monitoring a voltage value at a power supply end of the power supply cable on the power supply module side; and
measuring a voltage at a terminal end of the power supply cable connected to a load side, and detecting the potential difference between the two ends of the power supply cable based on the measured voltage value at the terminal end of the power supply cable and the voltage value at the power supply end of the power supply cable obtained by the monitoring.

10. The method of claim 8, wherein the calculating the input power value of the power supply module is to calculate an output power value of the power supply module based on the calculated current value on the power supply cable and the potential difference between the two ends of the power supply cable, and to calculate the input power value of the power supply module based on the calculated output power value of the power supply module according to the input/output characteristic of the power supply module.

11. The method of claim 8, further comprising measuring a voltage at a terminal end of the power supply cable connected to a load side, and detecting the potential difference between the two ends of the power supply cable based on the measured voltage value at the power supply end of the power supply cable and a rated output voltage value at a non-output time of the power supply module.

12. The method of claim 11, wherein the calculating the input power value of the power supply module is to calculate an output power value of the power supply module based on the calculated current value on the power supply cable and the potential difference between the two ends of the power supply cable, and to calculate the input power value of the power supply module based on the calculated output power of the power supply module according to the input/output characteristic of the power supply module.

13. The method of claim 8, further comprising:
receiving a voltage value of a power supply end of the power supply cable on the power supply module side; and
measuring a voltage value at a terminal end of the power supply cable connected to a load side, and to detect the potential difference between the two ends of the power supply cable based on the measured voltage value at the terminal end of the power supply cable and the received voltage value of the end of the power supply cable.

14. The method of claim 13, wherein the calculating the input power value of the power supply module is to calculate an output power value of the power supply module based on the calculated current value on the power supply cable and the potential difference between the two ends of the power supply cable, and to calculate the input power value of the power supply module based on the calculated output power value of the power supply module according to the input/output characteristic of the power supply module.

* * * * *